(12) United States Patent
Barnes et al.

(10) Patent No.: US 6,677,736 B1
(45) Date of Patent: Jan. 13, 2004

(54) ENERGY RECOVERY SYSTEM FOR DROOP COMPENSATION CIRCUITRY

(75) Inventors: John Arthur Barnes, Simi Valley, CA (US); James John Polston, Palmdale, CA (US); Makoto Andrew Igawa, Granada Hills, CA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 279 days.

(21) Appl. No.: 09/964,379

(22) Filed: Sep. 28, 2001

(51) Int. Cl.[7] .................................................. G05F 1/40
(52) U.S. Cl. ........................................................ 323/280
(58) Field of Search ................................. 323/265, 273, 323/280, 284, 351

(56) References Cited

U.S. PATENT DOCUMENTS

| | | | |
|---|---|---|---|
| 4,035,716 A | 7/1977 | Hutchinson | |
| 4,041,431 A | 8/1977 | Enoksen | |
| 4,237,555 A | * 12/1980 | Dishal ......................... | 455/108 |
| 4,533,863 A | 8/1985 | Luhn et al. | |
| 4,630,220 A | 12/1986 | Peckinpaugh | |
| 4,667,144 A | * 5/1987 | Jones et al. ................. | 323/271 |
| 4,761,702 A | 8/1988 | Pinard | |
| 4,893,228 A | 1/1990 | Orrick et al. | |
| 5,070,538 A | 12/1991 | Milberger et al. | |
| 5,117,174 A | 5/1992 | Kessler | |
| 5,170,493 A | 12/1992 | Roth | |
| 5,187,427 A | 2/1993 | Erdman | |
| 5,264,782 A | 11/1993 | Newton | |
| 5,298,851 A | 3/1994 | DeNardis | |
| 5,336,986 A | 8/1994 | Allman | |
| 5,359,276 A | 10/1994 | Mammano | |
| 5,672,959 A | 9/1997 | Der | |
| 5,905,646 A | * 5/1999 | Crewson et al. ............ | 363/132 |
| 5,938,769 A | 8/1999 | Hu | |
| 5,940,785 A | 8/1999 | Georgiou et al. | |
| 5,943,224 A | 8/1999 | Mao | |
| 5,959,852 A | 9/1999 | Deloy et al. | |
| 6,031,421 A | 2/2000 | McEwan | |
| 6,037,759 A | 3/2000 | Chen et al. | |
| 6,057,607 A | * 5/2000 | Rader et al. ................... | 307/11 |
| 6,114,817 A | 9/2000 | Fernsler | |
| 6,130,575 A | 10/2000 | Nelson et al. | |
| 6,160,591 A | 12/2000 | Stumfall et al. | |
| 6,181,116 B1 | 1/2001 | Jansen | |
| 6,188,206 B1 | 2/2001 | Nguyen et al. | |
| 6,211,661 B1 | 4/2001 | Eckhardt | |
| 6,232,893 B1 | 5/2001 | Cliff et al. | |
| 6,246,221 B1 | 6/2001 | Xi | |
| 6,304,131 B1 | 10/2001 | Huggins et al. | |

\* cited by examiner

*Primary Examiner*—Adolf D. Berhane
(74) *Attorney, Agent, or Firm*—Hunton & Williams

(57) ABSTRACT

The invention comprises a voltage regulator including a droop compensation circuit and an energy recovery circuit. The droop compensation circuit adjusts the regulator output voltage to compensate for droop, such as voltage regulator droop, load transistor droop, or other variations to droop that occur in a load circuit over time. The droop compensation circuit compensates for voltage droop by providing an adjusted voltage input to the voltage regulator. The energy recovery circuit permits excess energy at the output of the voltage regulator to be transferred from the voltage output of the regulator to a voltage input of the regulator upon completion of a transmit gate during which the droop compensation circuit is operative. The energy recovery circuit can reduce heat generation and improve power efficiency and reliability.

38 Claims, 7 Drawing Sheets

ENERGY RECOVERY SYSTEM FOR DROOP COMPENSATION CIRCUITRY

GOVERNMENT RIGHTS

Because the invention was made under contract N00024-98-C-5200 (Department of the Navy), the Government may have certain rights in the invention.

FIELD OF THE INVENTION

The present invention relates generally to a droop compensated regulator used to regulate the input to transistor-based loads, such as RF preamplifiers and amplifiers employed for driving solid state pulsed radar transmitters.

BACKGROUND OF THE INVENTION

Voltage regulators are used in a variety of contexts for providing and regulating the voltage applied to electronic circuit devices. Just by way of example, voltage regulators are an important system component in solid state pulsed radar systems. In that context, voltage regulators are used to regulate the voltage supplied to various loads such as preamplifiers or amplifiers that power the radar transmitter circuitry.

One common problem with linear voltage regulators is that their voltage output will tend to decrease during loading (e.g., during transmit gate pulses) until the regulator senses the error and begins to regulate the output voltage. This decrease is sometimes referred to as the output voltage "droop." Generally, this problem is attributable to the voltage regulator output capacitance where the voltage across the capacitor decreases or droops (dV=1/C*Idt). In the context of a pulsed radar system, this droop in the output voltage causes a decrease in the RF transistor power output. This results in suboptimal system performance.

This problem of a decrease in the RF transistor output may worsen in systems having multiple cascaded stages, such as in a solid-state radar system with cascaded amplifiers. Accordingly, the performance loss accumulates.

Additionally, it is common that RF transistor-based circuits will tend to exhibit their own natural droop over the course of a powering cycle. For example, high (e.g., microwave) frequency RF transistor-based circuitry in a pulsed radar system will tend to exhibit a droop in gain that worsens over the course of the transmit pulse. This may be attributable to heating of the RF transistor junction during an RF pulse, which, in turn, may cause a decrease in the transistor output power during the RF transmit pulse. The RF output power is no longer constant throughout the RF pulse, resulting in suboptimal performance.

When a voltage regulator exhibiting its own droop is used with a transistor-based circuit having its own internal droop, the overall performance loss exacerbates. That is, the droop in the regulator output voltage causes a decrease in the RF transistor power output, thereby adding to an already decreasing output power that is caused by the characteristics of the RF transistor.

In summary, so-called "real world" systems using voltage regulators with real world RF transistor-based load circuits tend to suffer significant performance losses associated with regulator voltage droop and/or internal RF transistor gain droop. In high stability systems, like solid state-pulsed radar systems, these performance losses can be a significant problem. This problem can be mitigated somewhat by using custom transistors (or by screening commercial-off-the-shelf [COTS] transistors), but this may greatly increase the costs of production. In many markets, such as for low- to medium-production military applications, these cost increases may not be acceptable.

Finally, it can be readily appreciated that the problem of voltage droop exists in other contexts. For example, instead of a transistor load, there may be some other component, device, or system, whose output response (e.g., voltage, gain, power, etc.) exhibits some undesirable variation over time. Also, the variation of this output response or gain may increase over some time period, decrease over some time period, or increase and decrease at points over a time period. The common problem is that of how to control (or compensate for) the time variable output response in order to render the desired output response. Generally, the desired output response is constant or flat over some period of time for the system at issue. Sometimes, a non-flat response may be desired.

Other problems and drawbacks also exist.

SUMMARY OF THE INVENTION

An embodiment of the present invention comprises a voltage regulator including a droop compensation circuit and an energy recovery circuit. The droop compensation circuit compensates for a regulator output voltage that is to be changed over a period of time. The regulator output voltage could be changed to compensate for regulator output voltage droop, load transistor droop, and/or any other output response that varies over time. The energy recovery circuit permits excess energy stored in the regulator output to be transferred from the regulator output to the input of the regulator. This transfer of energy may occur upon completion of a transmit gate during which the droop compensation circuit is operative.

The energy recovery circuit may include an active switch that is enabled in such a way that current can flow from an output capacitance of the voltage regulator to an input capacitance in the voltage regulator. According to an aspect of the invention, the switch is a switching transistor that is activated by drive pulses issued by a controller in the energy recovery circuit. These drive pulses may be issued over a fixed or variable time period. These drive pulses may be issued at a fixed or variable frequency rate.

The energy recovery circuit can accelerate the recovery time of the regulator voltage output back to a nominal value in order to prepare for the next transmit gate. The energy recovery circuit may improve the overall power efficiency of the voltage regulator, reduce heat generation, and improve reliability.

Accordingly, it is one object of the present invention to overcome one or more of the aforementioned and other limitations of existing systems and methods for regulating voltage supplied to an electronic circuit.

It is another object of the invention to provide a voltage regulator that solves or mitigates the problem of droop in electronic circuits in a manner that preserves power efficiency.

It is another object of the invention to provide a voltage regulator that solves or mitigates the problem of droop in electronic circuits in a manner that avoids excessive heat generation.

It is another object of the invention to provide a voltage regulator that solves or mitigates the problem of droop in electronic circuits in a manner that maintains good reliability.

The accompanying drawings are included to provide a further understanding of the invention and are incorporated in and constitute part of this specification, illustrate several embodiments of the invention and, together with the description, serve to explain the principles of the invention. It will become apparent from the drawings and detailed description that other objects, advantages and benefits of the invention also exist.

Additional features and advantages of the invention will be set forth in the description that follows, and in part will be apparent from the description, or may be learned by practice of the invention. The objectives and other advantages of the invention will be realized and attained by the system and methods, particularly pointed out in the written description and claims hereof as well as the appended drawings.

BRIEF DESCRIPTION OF THE DRAWINGS

The purpose and advantages of the present invention will be apparent to those of skill in the art from the following detailed description in conjunction with the appended drawings in which like reference characters are used to indicate like elements, and in which.

DETAILED DESCRIPTION OF THE INVENTION

The invention relates to subject matter disclosed in the application Ser. No. 09/964,741 entitled "Droop Compensation Circuitry," which was filed in the name of inventors Raymond E. Hann, James J. Polston, and Makoto A. Igawa, and which is hereby incorporated by reference in its entirety.

Figure 1:
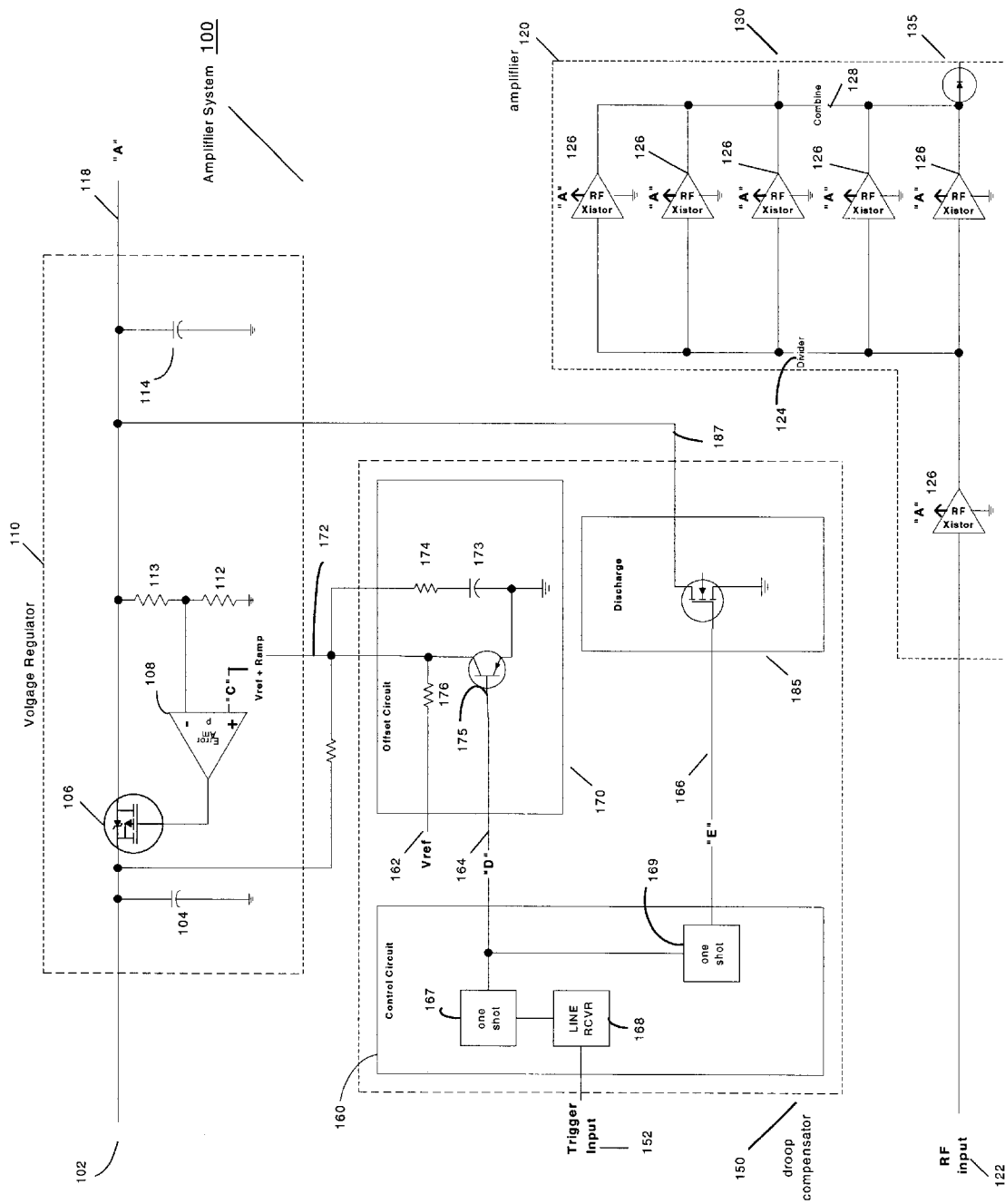
FIG. 1 is a schematic block diagram of an exemplary amplifier system according to an embodiment of the invention for addressing the problem of voltage droop.

FIG. 1 is an exemplary amplifier system according to an embodiment of the invention for addressing the problem of voltage droop. Exemplary amplifier system 100 may be a preamplifier system, amplifier system, or a combination of the two. Amplifier system 100 includes voltage regulator 110, amplifier 120, and droop compensator 150.

According to an embodiment, the operation of amplifier system 100 is as follows. Droop compensator 150 provides a voltage to an input of voltage regulator 110. Preferably, this voltage is an adjusted voltage comprising a nominal reference voltage adjusted by an offset voltage. The offset voltage can be a positive offset, a negative offset, or a zero offset. Preferably, when droop compensator 150 is enabled during a transmit cycle, the offset voltage will be a positive offset so that the adjusted voltage supplied to voltage regulator 110 will be adjusted upwards. This upward adjustment can compensate for a droop in either the regulator output voltage, the RF transistor output, or both.

The droop may be associated with the voltage regulator 110 outputs, with the amplifier 120 outputs, with both the voltage regulator 110 output and the amplifier 120 output, or with another system component. The droop may be an expected or an anticipated droop that is based on empirical measurements or theoretical calculations. Generally, the ultimate goal is to achieve a predetermined result at of the two outputs, or both. The values for the expected droop (or for the adjusted voltage used to compensate for the expected droop) may be selected or computed by droop compensator 150. For example, values for the expected droop (or for the adjusted voltage used to compensate for the expected droop) could be selected (e.g., selected from a memory) by droop compensator 150, which are then used to cause the addition of an appropriate offset voltage. In another example, the values for the expected droop (or for the adjusted voltage used to compensate for the expected droop) could be computed by droop compensator 150 based on an equation.

According to another embodiment, the values for the droop (or for the adjusted voltage used to compensate for the droop) could be based on a measured or projected droop based on a feedback measurement. For example, the droop of voltage regulator 110 could be measured or projected based on a feedback (not shown) from regulator output voltage 118. Similarly, the droop of amplifier 120 could be measured or projected based on a feedback (not shown) from RF output 130 or detected RF output 135. Accordingly, such a feedback could be used by droop compensator 150 to determine how much droop compensation (e.g., voltage offset) is appropriate for the circumstance.

Once the offset voltage is computed or determined, droop compensator 150 provides the adjusted voltage to the input of voltage regulator 110. This adjusted voltage (which can be referred to as $V_{REFERENCE}'$) controls the output voltage 118 of voltage regulator 110. Output voltage 118 of regulator 110 is provided as an input to amplifier 120. Preferably, output voltage 118 is provided as an input to one or more transistors (or like semiconductor devices) in amplifier 120. For example, output voltage 118 may be provided as an input voltage to the RF transistor circuits (e.g., amplifier 120). There may also be a RF input 122 to amplifier 120. Generally, the characteristics of RF input 122 depend on the system specification for a particular application, as does the operational frequency of the RF transistor circuits (e.g., amplifier 120).

Because the adjusted voltage compensates for droop, the output response of the system component at issue can be adjusted to provide a desired output response. For example, the desired output response may be a flat or a non-flat response. Preferably, the desired output response is a flat response.

According to one embodiment, the desired output response is a flat response for the output voltage 118 of regulator 110. According to another embodiment, the desired output response is a flat response for the RF pulses at output 130. According to yet another embodiment, the desired output response is a non-flat response for amplifier 120, such as an output response that ramps up or increases during the course of a transmit cycle. Those of skill in the art will readily appreciate that many different variations of the desired output response can be accommodated depending on the application without departing from the spirit and scope of the present invention.

According to an embodiment, droop compensator 150 comprises a control circuit 160 and an offset circuit 170. Control circuit 160 controls a variable voltage to be input to voltage regulator 110, i.e., an adjusted voltage. Offset circuit 170 generates the variable voltage. For example, offset circuit 170 may generate an offset voltage to be combined with a reference voltage. Offset circuit 170 may also generate the nominal reference voltage, or the nominal reference voltage may be received as an input to offset circuit 170.

According to a preferred embodiment, droop compensator 150 further includes a discharge circuit 185. Discharge circuit 185 permits discharging of output voltage 118 of voltage regulator 110. This can be employed to accelerate the return of output voltage 118 to a nominal value, such as to a nominal output voltage. Accordingly, inclusion of such a discharge circuit 185 can improve the so-called "recovery time" of voltage regulator 110 following the end of a transmit cycle.

According to an embodiment, control circuit 160 has an input trigger 152 for activating/deactivating droop compensator 150. Control circuit 160 also has a transmit gate 164 output that is coupled to offset circuit 170. Control circuit 160 may also include a discharge gate 166 that is used to activate/deactivate the discharge circuit 185.

Control circuit 160 can be implemented in a multitude of fashions, and the design of control circuit 160 for a particular application is well within the skill of the ordinary artisan. For example, control circuit 160 may include circuitry for controlling the sequencing of offset circuit 170 and discharge circuit 185. Control circuit 160 may include input components (e.g., line receivers), timing generators (e.g., one shot devices, D/A signal converters, and so forth), and sensing circuits (e.g., resistive divider, current sensors, and so forth).

According to one embodiment, control circuit 160 includes one shot device 167, line receiver 168, and one shot device 169. After receiving trigger input 152, line receiver 168 enables one shot device 167 to activate/deactivate droop compensation. Line receiver 168 may also enable one shot 169 to activate/deactivate discharge circuit 185.

According to an embodiment, offset circuit 170 has a nominal reference voltage input 162, a transmit gate 164 that is input from control circuit 160, and an adjusted output voltage 172 that is provided to voltage regulator 110.

A variety of implementations of offset circuit 170 could be used, and the design of offset circuit 170 for a particular application is well within the skill of the ordinary artisan. For example, offset circuit 170 may include input signal circuits (e.g., line receivers, differential inputs, and so forth), ramp generators (e.g., RC networks, adders, and so forth), and discharge circuits for ramp generators (e.g., active type energy dump circuits and so forth).

According to one embodiment, offset circuit 170 comprises a waveform (ramp) generating circuit. According to a preferred embodiment, offset circuit 170 includes a D-A converter to generate a waveform according to a desired output wave shape. This wave shape may be linear or nonlinear. In one configuration, offset circuit 170 includes a ramp generator comprised of capacitor 173 and resistance 174, an active type ramp discharge 175, and input resistance 176. This configuration is provided merely as an example of many implementations that could be employed for offset circuit 170 without departing from the spirit and scope of the invention.

According to an embodiment, discharge circuit 185 includes a discharge trigger 166 input from control circuit 160. Preferably, discharge circuit 185 also includes a connection 187 to output voltage 118 so that energy can be dissipated when output voltage 118 is to be reduced.

Discharge circuit 185 can be implemented in a various fashions and its design for a particular application is well within the skill of the ordinary artisan. Discharge circuit 185 may include activate components, such as transistors, and associated passive components, such as resistors, which are used to discharge excessive voltage from the regulator output prior to the beginning of the next load on time period. According to a preferred embodiment, discharge circuit 185 is an active switch circuit where the output capacitance 114 can be discharged in a finite amount of time. For example, discharge circuit 185 may include a power MOSFET with low Rdson being gated by a control signal. Using such an active device in discharge circuit 185 decreases the amount of power wasted during non-load times.

Continuing with FIG. 1, according to an embodiment, voltage regulator 110 may comprise a linear regulator. Preferably, voltage regulator 110 is an on-line linear regulator having a first input capacitor 104, a second output capacitor 114, and an error amplifier or differential amplifier 108. Preferably, the first input capacitor 104 has a value greater than the second output capacitor 114. According to an embodiment, voltage regulator 110 further comprises an output resistance. The output resistance may include a first resistance 112 and a second resistance 113 forming a sampling circuit to send a sample of the output voltage back to the input of the error amplifier 108.

According to an embodiment, amplifier 120 is a transistor-based load circuit having an RF input 122, multiple transistors 126, and an RF output 130. There may be a detected RF output 135 for measuring the output of amplifier 120. Preferably, amplifier 120 also includes a divider 124 and a combiner 128.

In the preferred embodiment of droop compensator 150, compensation is provided to offset the droop caused by the regulator output capacitance (e.g., capacitor 114) and the inherent droop of amplifier 120 (e.g., the droop created by transistors 126). In one embodiment, the adjusted output voltage 172 may be ramped up in order to provide this compensation.

Figure 2:
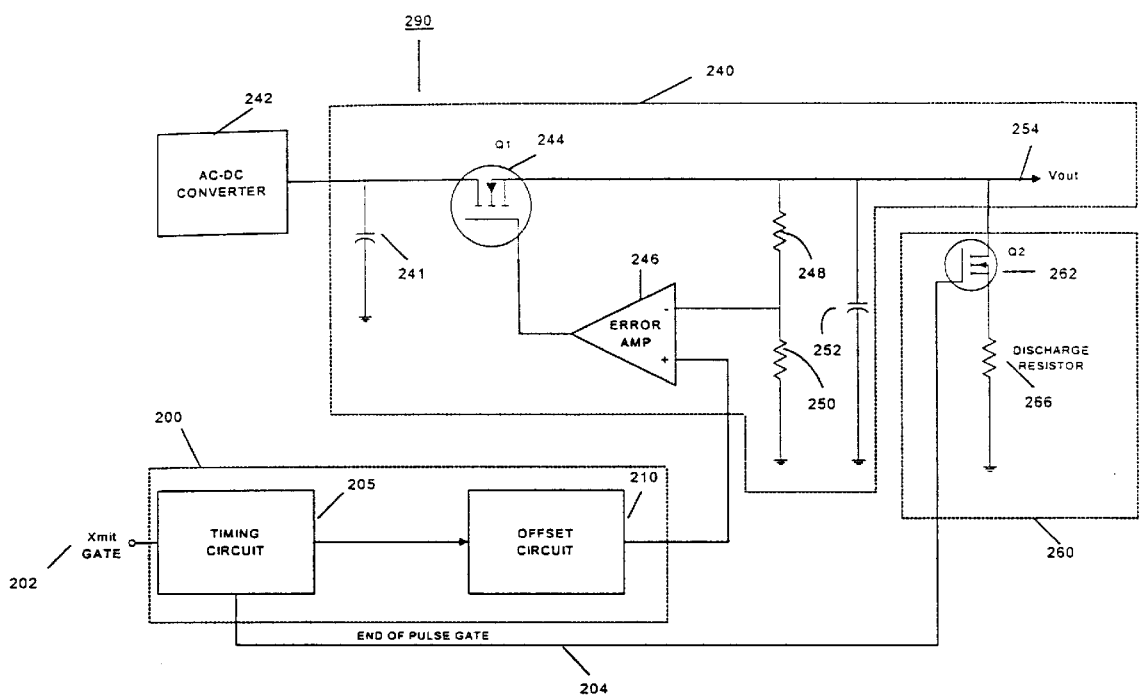
FIG. 2 is a schematic block diagram of another exemplary amplifier system for addressing the problem of voltage droop.

FIG. 2 is a block diagram of yet another exemplary amplifier system 290. Here, amplifier system 290 incorporates an AC-DC converter input 242, a voltage regulator 240, a droop compensation circuit 200, and a discharge circuit 260.

Voltage regulator 240 includes an input capacitor 241; output capacitor 252; pass transistor 244; error/differential amplifier 246; first resistance 250 and second resistance 248 (for output voltage sensing); and regulator voltage output 254. Droop compensation circuit 200 includes transmit gate 202 for inputting the transmit gate signal, timing circuit 205 for controlling the timing of offset circuit 210 and discharge circuit 260, and offset circuit 210 for generating an adjusted reference voltage supplied to voltage regulator 240.

In FIG. 2, discharge circuit 260 comprises a discharge transistor 262 and a discharge resistor 266. Generally, at the end of the transmit gate 202 on state, timing circuit 205 sends an end-of-pulse-gate signal 204 that activates discharge transistor 262 so that current can flow through resistor 266. Accordingly, a regulator voltage output 254 that was increased (e.g., to 44 V) during the course of a transmit pulse can be reduced back down to its nominal value (e.g., to 40 V) prior to the next transmit gate on state. The discharge resistor (e.g., element 266 of FIG. 2) must be of a sufficiently low value to discharge the ramp voltage back to the nominal voltage level before the start of the next load pulse.

As discussed above, the implementation of discharge circuit 260 (or discharge circuit 185 of FIG. 1) improves the recovery time of the regulator output voltage 254 (or regulator output voltage 118 of FIG. 1), thereby permitting more rapid duty cycles. Thus, the discharge circuit 260 (or discharge circuit 185 of FIG. 1) provides an improvement to a droop compensating regulator.

Like virtually all engineering design decisions, every improvement involves some kind of tradeoff in performance, cost, or complexity. By design, a discharge circuit, such as that described in connection with FIGS. 1 and 2, dissipates power at the end of a transmit pulse when the regulator has to decrease its output voltage back to a nominal voltage level in preparation for the next pulse.

Accordingly, discharge of the excessive voltage through a resistor, whether active or passive, can result in high power dissipation. This power dissipation increases as the adjusted voltage for a droop compensating regulator increases. This high dissipation varies according to transmit gate length and the amplitude of the adjusted regulator output voltage.

This high power dissipation may result in reduced unit efficiency and reduced unit reliability due to higher operating temperatures of surrounding components.

Accordingly, a further enhancement to a droop compensation circuit includes the substitution or addition of a so-called "energy recovery circuit." Rather than dissipating the discharge energy at a resistor, an energy recovery circuit can return the discharge energy back to an input capacitor of the voltage regulator. Accordingly, most of the excess energy in the regulator output can effectively be fed back to the regulator input.

According to one embodiment, an energy recovery circuit may be complemented with a dissipation circuit (e.g., a discharge circuit like element 185 of FIG. 1 or element 260 of FIG. 2) to dissipate any excess energy. For example, if for some reason the input capacitance could not charge fast enough to accommodate the feedback energy, or if the input capacitance could not tolerate an elevated voltage, the excess energy could be dissipated by resistance in the complementary dissipation circuit.

Figure 3:
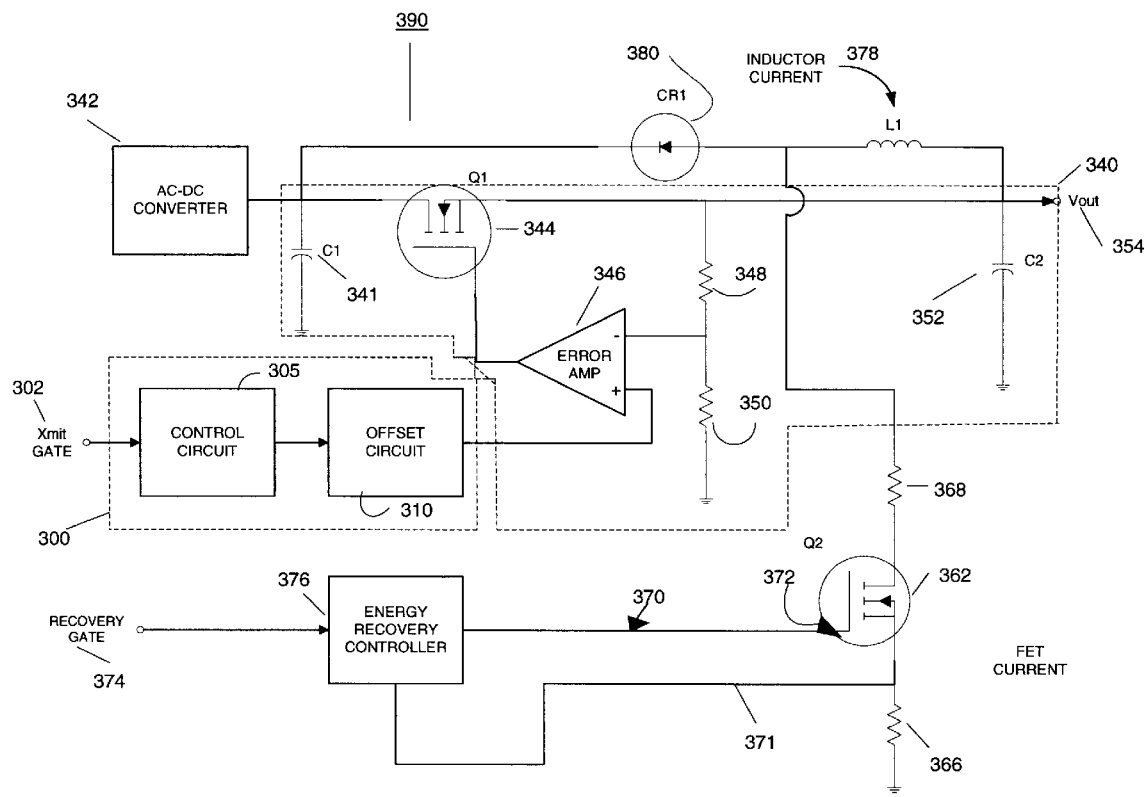
FIG. 3 is a block diagram of an exemplary voltage regulator according to an embodiment of the invention incorporating an energy recovery circuit.

FIG. 3 is a block diagram of an exemplary voltage regulator 390 according to an embodiment of the invention incorporating an energy recovery circuit. Voltage regulator 390 includes AC-DC converter input 342, linear regulator 340, droop compensation circuitry 300, and energy recovery circuitry (the energy recovery circuitry component is hereafter referred to as energy recovery circuit 3000 for convenience).

Droop compensation circuitry 300 may include a control circuit 305 and an offset circuit 310 similar to those discussed in connection with FIG. 1. Linear regulator 340 is similar to that discussed in connection with FIG. 2. Linear regulator 340 includes input capacitor 341, output capacitor 352, pass transistor 344, error/differential amplifier 346, first resistance 350, second resistance 348, and regulator voltage output 354.

As previously described, transmit gate 302 provides transmit gate pulses that cause droop compensation circuitry 300 to provide an adjusted voltage to linear regulator 340. The adjusted voltage causes linear regulator 340 to compensate for various droops. The droop may be associated with a regulator output droop, with a load transistor gain droop, or with the total system droop resulting from any combination of regulator droop and load droop over the course of a time period.

Energy recovery circuit 3000 comprises circuitry electrically coupled to the regulator voltage output 354 in order to maintain the desired output voltage. In other words, energy recovery circuit 3000 provides energy recovery, or energy recovery and energy dissipation. Rather than simply dissipating the discharged energy, energy recovery circuit 3000 can return excess energy from the regulator output circuit back to input capacitor 341. According to an embodiment of energy recovery circuit 3000, excess energy can be dissipated by a complementary dissipation circuit component (not shown in FIG. 3).

According to one embodiment, energy recovery circuit 3000 includes an energy recovery controller 376, a switch 362, an isolation device 380, and an inductor 378.

Energy recovery controller 376 controls energy recovery circuitry 3000 by engaging switch 362. Preferably, energy recovery controller 376 is engaged by a recovery gate 374 signal that initiates at the end of a transmit gate (e.g., transmit gate 302). In response, energy recovery controller 376 transmits switch activation signals 370 via switch input 372 that activates switch 362. Engaging switch 362 causes isolation device 380 to open so that current can flow to inductor 378. Current flow in inductor 378 removes excess energy from output capacitor 352 and stores the energy from the elevated voltage in the inductor. When switch 362 turns off, the energy stored in inductor 378 is transferred to regulator input capacitor 341. The current flow is used to charge up input capacitor 341 and bring voltage output 354 down, preferably down to a nominal voltage.

Switch 362 may be an active device, such as a Field Effect Transistor (FET), bipolar transistor, or an IGBT. Preferably, switch 362 is a FET. Where switch 362 is a FET, switch input 372 is the FET gate input. Isolation device 380 is a device capable of isolating the input and output circuits of the voltage regulator while inductor 378 is storing energy. Preferably, isolation device 380 is a diode, such as an ultra-fast recovery-type Schottky diode. The value of inductor 378 is determined by the application, as is the case for other components.

According to one embodiment, energy recovery circuit 3000 further includes first resistor 366 (for current sensing) and second resistor 368 (for current limiting). Preferably, first resistor 366 has a low resistance value with low inductance. Second resistor 368 has a value determined by the application. In one embodiment, second resistor 368 need not be included.

Energy recovery circuit 3000 can be viewed as a boost converter where the output of the voltage regulator is the input to the boost converter, and the input to the voltage regulator is the output of the boost converter.

Energy recovery circuit 3000 can accelerate the recovery time of the regulator voltage output back to a nominal value in order to prepare for the next transmit gate. Thus, energy recovery circuit 3000 can improve the overall power efficiency of the voltage regulator, can reduce heat generation, and can improve reliability. The reduction in heat generation is a result of recovering excess circuit energy at the output of the regulator and storing it back in the regulator input circuits. By recovering the excess energy, there is no need (or there is a reduced need) to dissipate it as heat. This action of recovering the excess energy thereby improves overall system efficiency.

Figure 4:
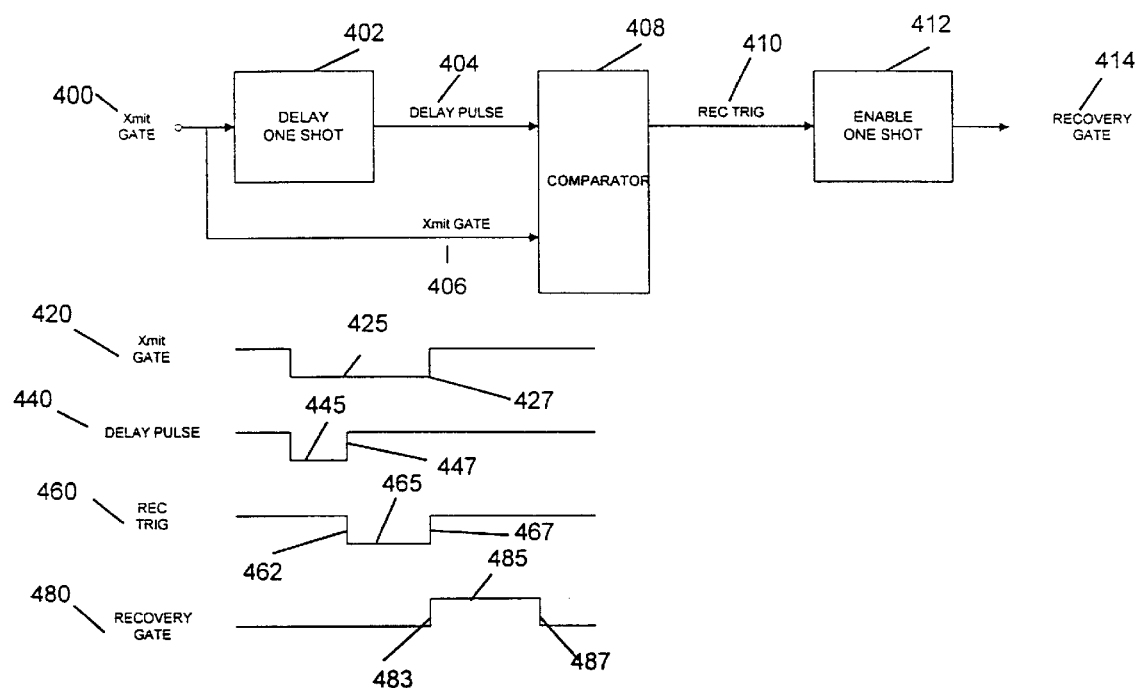
FIG. 4 is an exemplary timing sequence that may be employed according to an embodiment of the invention incorporating an energy recovery circuit.

An energy recovery system, such as the energy recovery circuit 3000 of FIG. 3, can operate in various fashions. For example, energy recovery circuitry 3000 could operate as set forth in the exemplary timing diagram of FIG. 4. FIG. 4 represents an exemplary timing sequence; other timing sequences could easily be employed without departing from the scope and spirit of the present invention.

FIG. 4 shows recovery gate timing 400, transmit gate timing 420, delay pulse timing 440, recovery trigger timing 460, and recovery gate timing 480. According to recovery gate timing 400 of FIG. 4, the transmit gate may initiate or engage a delay circuit, such as a one shot device 402, which outputs a delay pulse 404. One shot device 402 could be a retriggerable monostable multivibrator, a digital timing circuit, or another implementation of a delay circuit. Delay pulse 404 may represent a predetermined amount of delay that will delay a recovery trigger for a period of time after the initiation of the transmit gate. Comparator 408 generates recovery trigger 410 if the transmit gate width 406 is longer than delay pulse 404. The recovery trigger 410 generated by the comparator 408 engages an enable one shot element 412, which generates a recovery gate 414.

Transmit gate timing 420 shows the period 425 during which the transmit gate is in the on state, terminated by trailing edge 427. Delay pulse timing 440 shows the predetermined delay 445 for initiating a recovery trigger, terminated by trailing edge 447. Recovery trigger timing 460 shows that the recovery trigger leading edge 462 is coincident or nearly coincident with trailing edge 447 of the delay pulse. The recovery trigger has a duration 465 terminated by trailing edge 467 that is commensurate with trailing edge 427 of the transmit gate timing 420. Recovery gate timing 480 shows that the recovery gate leading edge 483 is commensurate with trailing edge 467 of recovery trigger timing 460. The recovery gate has a duration 485 that is terminated by trailing edge 487.

The duration 485 of the recovery gate may be fixed or variable. In a preferred embodiment where duration 485 is fixed, the duration 485 is selected so that it is sufficiently long to reduce the highest expected adjusted regulator voltage output back to the nominal regulator voltage output within duration 485.

In another embodiment where duration 485 is variable, the duration 485 may depend on the magnitude of the voltage reduction that has to occur to return the regulator to its nominal regulator voltage output. For example, referring back to FIG. 3, regulator voltage output 354 may be monitored or measured during energy recovery to determine the appropriate length of duration 485. When the voltage output 354 reflects a nominal voltage output, the recovery gate can return to an off state as it terminates with trailing edge 487.

In yet another embodiment, where duration 485 is variable, the length of duration 485 can be based on a computation. For example, rather than measuring in real-time or quasi-real-time the regulator voltage output 354 to determine when the recovery gate can terminate, regulator 390 can perform a computation at the beginning of the energy recovery phase. Thus, regulator 390 can compute an appropriate duration 485 based on the regulator voltage output 354. For example, if the regulator voltage output is 44 V and the nominal voltage output is 40 V, regulator 390 can compute how much time is needed to effectuate the reduction based on the components of regulator 390.

In a related embodiment, where duration 485 is variable, the length of duration 485 can be based on a numerical look-up. In this embodiment, tables or data arrays could be looked up in order to determine an appropriate duration 485 for the circumstance.

Having described an exemplary timing sequence in FIG. 4, the general operation of a regulator with energy recovery can now be described in connection with an embodiment of the invention. Referring back to FIG. 3, upon termination of the regulator load pulse (e.g., trailing edge 427 of FIG. 4), the adjusted regulator voltage output has to recover back to its nominal voltage level.

The recovery gate input 374 (e.g., recovery gate 480 of FIG. 4) enables energy a recovery controller 376, which starts discharging the excess energy. Energy recovery controller 376 does this by issuing switch activation signals 370 to switch 362. Preferably, switch activation signals 370 comprise gate pulses or FET drive pulses. Preferably, switching 362 is an FET transistor that is engaged or turned on by these pulses.

Switch activation signals 370 are issued by energy recovery controller 376 for the duration 485 (FIG. 4) of the recovery gate. Switch activation signals 370 could comprise a string of pulses that sequentially turn switch 362 on and off, thereby allowing energy to be transferred from output capacitor 352 through inductor 378 and isolation device 380 back into input capacitor 341. For example, switch 362 may be an FET transistor, which while in the conduction mode, turns a diode 380 off so that current can pass into inductor 378 as output capacitor 352 discharges. Current flow though FET 362 charges inductor 378 towards the voltage level of capacitor 352. When FET 362 switches off, inductor 378 releases its energy through diode 380 and begins placing the excess charge on input capacitor 341. This cycle repeats until energy recovery controller 376 is disabled.

Preferably, switch activation signals 370 are pulses that may be issued at a fixed frequency or at a variable frequency. For example, switch activation signals 370 could be pulses issued at a fixed frequency, such as in the range of about 9.0–10.0 kHz. Of course, the frequency of switching is generally determined by the application. In another example, switch activation signals 370 could be pulses issued at a frequency that varies depending on the circumstance. For example, this frequency may be higher or lower depending on how much energy has to be recovered from capacitor 352 prior to the next gate pulse.

Energy recovery controller 376 may also include a line 371 that comprises a scaled (by first resistor 366) current feedback to energy recovery controller 376. Line 371 is used to measure how much current is passing through switch 362 in order to prevent excessive levels of current. According to an embodiment, if current levels are too high, energy recovery controller 376 may end the switch activation signal 370 (i.e., end a drive pulse). Therefore, even in a fixed frequency embodiment, the rate of issuance of gate pulses and/or the length of individual gate pulses may vary somewhat due to excessive current states.

Other embodiments of the aforementioned over-current circuitry might include a current transformer or a Hall Effects device.

Figure 5:
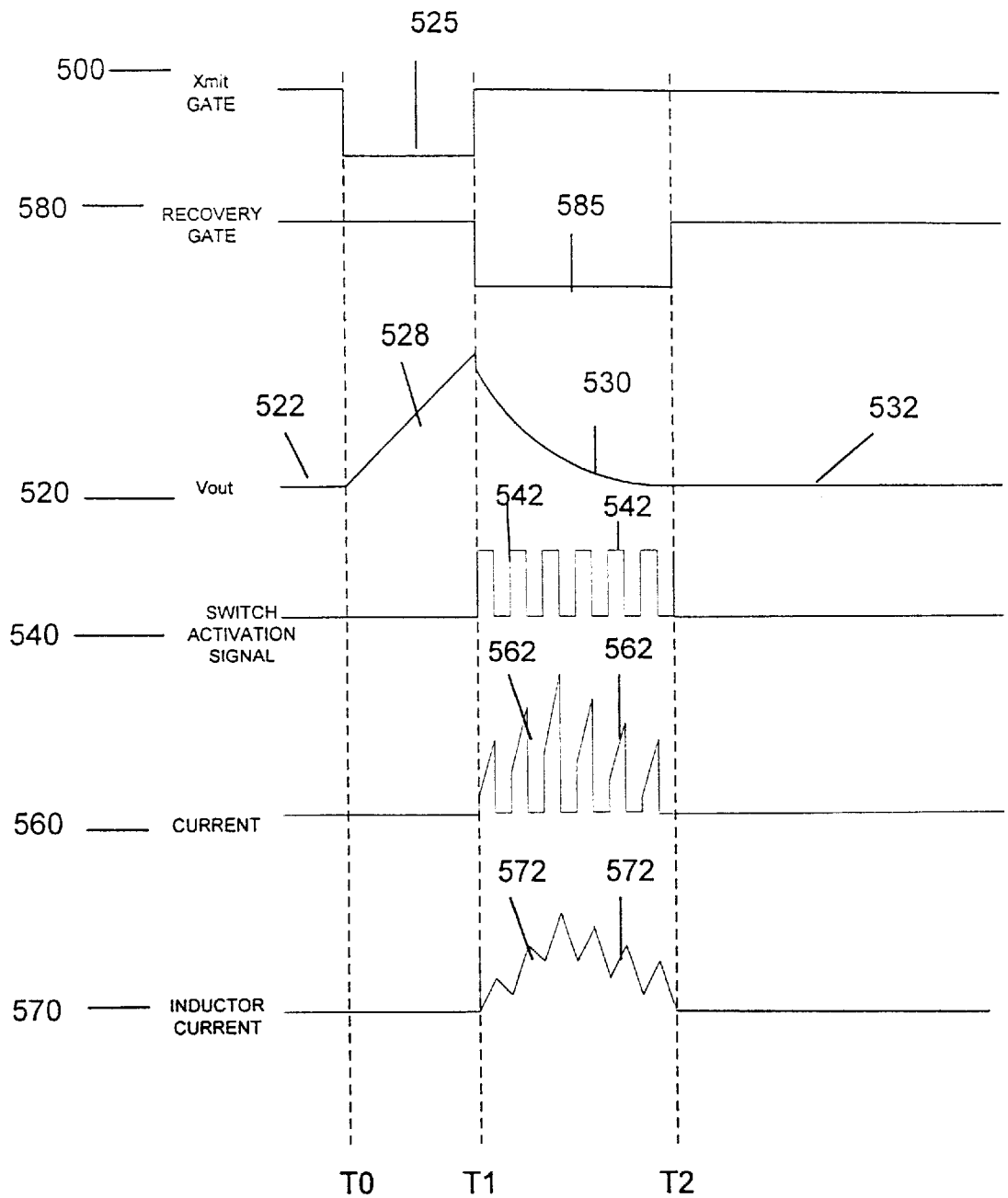
FIG. 5 is an illustration of exemplary waveforms generated in accordance with an embodiment of the invention.

FIG. 5 is an illustration of exemplary waveforms generated in accordance with an embodiment of the invention. The person of ordinary skill in the art will understand that the waveforms of FIG. 5 are illustrative and are not intended to define the operation of any particular energy recovery system design.

FIG. 5 shows transmit gate 500, which is engaged during period 525 beginning at T0 and ending at T1. Recovery gate 580 is engaged for a duration 585, which may be fixed or variable, as discussed previously, and which begins at T1 and ends at T2.

Prior to the on state of the transmit gate 500 (T0), the regulator voltage output 520 is at a nominal value 522.

During the transmit gate on state (period 525 from T0–T1), the regulator voltage output 520 increases to account for or to compensate for voltage droop or some other system requirement, as reflected by voltage increase 528. After the transmit gate ends (T1), the regulator voltage output 520 falls off at an accelerated rate 530 in response to engagement of the energy recovery circuitry until it returns to about the nominal value 522 in segment 532 after the end of the recovery gate (T2).

Following the end of transmit gate 500 (T1), switch activation signals 540 are issued, which may take the form of a series of drive pulses 542. Switch activation signals 540 cause current 560 to pass through a switch, such as the switch 362 of FIG. 3. Preferably, switch 362 is a switching FET through which currents 562 will pass commensurate with drive pulses 542. As shown in FIG. 5, inductor current 570 includes a series of increases 572 generally commensurate with currents 562.

Figure 6:
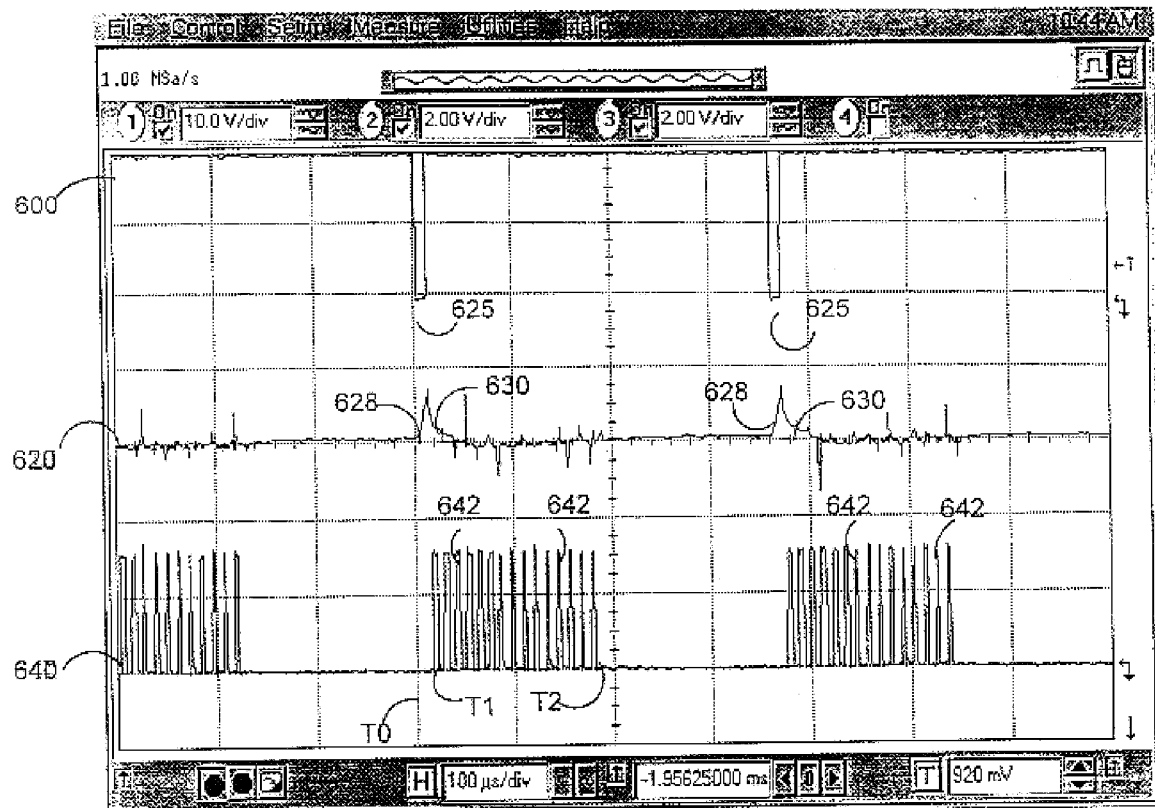
FIG. 6 is another illustration of exemplary waveforms generated in accordance with an embodiment of the invention.

FIG. 6 illustrates waveforms of an operational energy recovery circuit used in conjunction with a droop-compensating regulator according to an embodiment of the invention. The voltage regulator tested for FIG. 6 had an input capacitance (e.g., input capacitance 341 of FIG. 3) of about 11,000 microfarads and an output capacitance (e.g., output capacitance 352 of FIG. 3) of about 240 microfarads. The transmit gate pulsewidth in FIG. 6 was about 11 microseconds.

Graph 600 of FIG. 6 is the transmit gate waveform, which includes transmit gate on state 625 during the period from T0 to T1. Graph 620 is the regulator voltage output, which includes areas of voltage increase 628 during transmit gate on states 625 and areas of voltage decrease 630. The areas of voltage decrease 630 begin at about T1 when, as reflected in graph 640, where the gate pulses 642 begin. As reflected in FIG. 6, in this example, the voltage decrease 630 returns to the voltage nominal value well before T2, the end of gate pulses 642.

Figure 7:
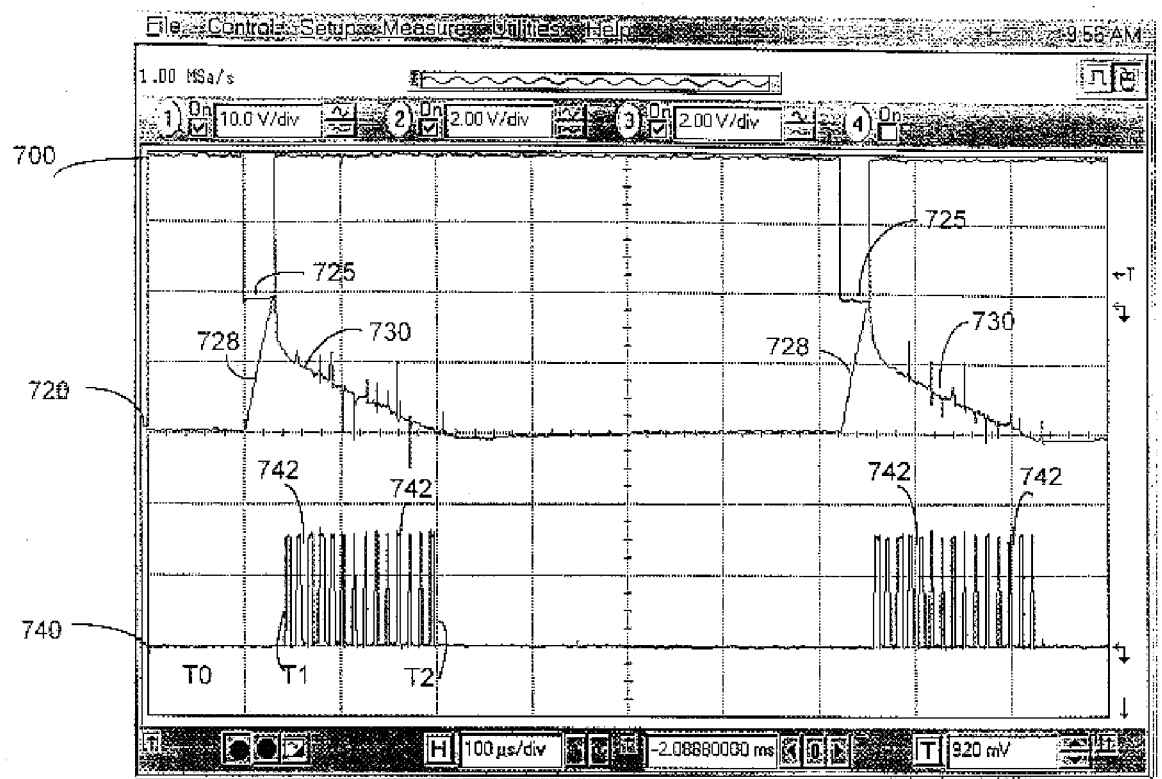
FIG. 7 is another illustration of exemplary waveforms generated in accordance with an embodiment of the invention.

FIG. 7 is similar to FIG. 6, except the transmit gate pulsewidth 725 in FIG. 7 was about 32 microseconds, as reflected in graph 700. Graph 740 illustrates the gate pulses 742, which begin at about T1 and end at about T2. Graph 720 illustrates the regulator voltage output, which includes areas of voltage increase 728 (higher than in FIG. 6 due to the longer transmit gate) during pulsewidth 725 and areas of voltage decrease 730 during gate pulses 742. As reflected in FIG. 7, the regulator voltage output returns to a nominal value well before the next transmit gate.

Having described an energy recovery circuit that can improve the performance of droop compensation circuitry and the overall system, a number of beneficial applications and advantages are apparent, including, but not limited to the following: improved unit efficiency over dissipative circuits; recovery of a substantial proportion (perhaps as much as 80%) of excess energy at the output of a regulator; reduced unit temperature rise over dissipative circuits; increased unit reliability due to lower operating temperature of components surrounding the recovery circuit; reduced system minimum inter-pulse period due to faster discharge time of regulator output voltage back to the normal DC voltage; reduced system power requirements; and reduced system cost due to enhanced efficiency. Other beneficial applications and advantages may exist.

Other embodiments and uses of this invention will be apparent to those having ordinary skill in the art upon consideration of the specification and practice of the invention disclosed herein. The specification and examples given should be considered exemplary only, and it is contemplated that the appended claims will cover any other such embodiments or modifications as fall within the true scope of the invention.

What is claimed is:

1. A voltage regulator for regulating voltage supplied to a circuit, comprising:
   means for regulating a voltage supplied to the circuit, the means for regulating including a voltage input and a voltage output;
   means for compensating for a voltage droop that occurs over a time; and
   means for providing energy recovery from the voltage output to the voltage input.

2. The voltage regulator of claim 1, wherein the means for providing energy recovery causes energy from an output capacitor to be transferred to an input capacitor.

3. The voltage regulator of claim 1, wherein the means for providing energy recovery comprises a controller and a switch, and wherein the controller engages the switch at the end or following the end of a transmit gate in order to permit energy from an output capacitor to be transferred to an input capacitor.

4. The voltage regulator of claim 3, wherein the controller is engaged by a recovery gate that issues at the end or following the end of a transmit gate, and wherein the controller engages the switch by issuing a switch activation signal.

5. The voltage regulator of claim 4, wherein the switch is a transistor, and wherein the switch activation signal comprises a series of drive pulses that turn the transistor on and off.

6. The voltage regulator of claim 3, further comprising an isolation device through which the energy passes to the input capacitor.

7. The voltage regulator of claim 6, wherein the isolation device is a diode.

8. The voltage regulator of claim 7, further comprising an inductor through which the energy passes.

9. The voltage regulator of claim 8, further comprising a current feedback return from the switch to the controller in order to determine when current through the switch has exceeded a level.

10. The voltage regulator of claim 9, further comprising a first resistance in order to scale the current passing through the switch.

11. The voltage regulator of claim 10, further comprising a second resistance in order to limit the magnitude of the current passing through the first switch.

12. A voltage regulator for regulating voltage supplied to a circuit, comprising:
    a voltage regulator having a voltage input and a voltage output;
    a droop compensation circuit for compensating a voltage droop that occurs over a time; and
    an energy recovery circuit for reducing the voltage output following the end of a transmit gate.

13. The voltage regulator of claim 12, wherein the energy recovery circuit further comprises a dissipation circuit.

14. The voltage regulator of claim 12, wherein the energy recovery circuit transfers energy from an output capacitance of the voltage regulator to an input capacitance of the voltage regulator.

15. The voltage regulator of claim 14, wherein the dissipation circuit comprises a resistance used to dissipate energy from the output capacitance.

16. The voltage regulator of claim 14, wherein the energy recovery circuit comprises a switch and an inductance, and wherein the switch is activated at or following the end of the transmit gate in order to permit current to pass through the inductance.

17. The voltage regulator of claim 16, wherein the switch is an FET transistor.

18. The voltage regulator of claim 16, further comprising a controller and an isolation device.

19. The voltage regulator of claim 18, wherein the isolation device comprises a diode.

20. The voltage regulator of claim 12, wherein the energy recovery circuit reduces the voltage output to a nominal voltage output appropriate for a subsequent transmit gate.

21. An energy recovery circuit for use with a voltage regulator, comprising:
    means for controlling a switch that engages an energy recovery phase;
    means for transferring energy from a voltage output of the regulator to a voltage input of the regulator;
    wherein the means for controlling initiates the switch at or following the end of a transmit gate.

22. The energy recovery circuit of claim 21, wherein the means for controlling is a controller activated by a recovery gate issued at or following the end of the transmit gate.

23. The energy recovery circuit of claim 21, wherein the means for controlling is a controller that issues drive pulses in order to turn the switch on and off.

24. The energy recovery circuit of claim 23, wherein the switch is an active device.

25. The energy recovery circuit of claim 23, wherein the switch is a transistor.

26. The energy recovery circuit of claim 21, wherein the means for transferring energy comprises an inductor coupled between the voltage output and the voltage input.

27. The energy recovery circuit of claim 26, wherein the means for transferring energy further comprises a diode coupled between the voltage input and the voltage output.

28. The energy recovery circuit of claim 21, wherein the means for transferring energy transfers energy from an output capacitance of the voltage regulator to an input capacitance of the voltage regulator.

29. An energy recovery circuit for use with a voltage regulator, comprising:
    a controller for controlling a switch that initiates energy recovery;
    the switch comprising an active switching device;
    an inductor coupled between a voltage output of the voltage regulator and a voltage input of the voltage regulator; and
    an isolation device coupled between the voltage output and the voltage input.

30. The energy recovery circuit of claim 29, wherein energy from an output capacitor of the voltage output is transferred to an input capacitor of the voltage input through the inductor and the isolation device.

31. The energy recovery circuit of claim 29, wherein the controller controls the switch by issuing a series of drive pulses.

32. The energy recovery circuit of claim 31, wherein the overall duration of the series of drive pulses is fixed.

33. The energy recovery circuit of claim 31, wherein the overall duration of the series of drive pulses is variable, and wherein the variable overall duration is determined based on the amount of energy that is to be transferred from the voltage output to the voltage input.

34. The energy recovery circuit of claim 31, wherein the frequency of the drive pulses is fixed.

35. The energy recovery circuit of claim 31, wherein the frequency of the drive pulses is variable.

36. The energy recovery circuit of claim 29, further comprising a feedback from the active switching device to the controller for monitoring a current passing through the transistor.

37. The energy recovery circuit of claim 36, further comprising a resistance for limiting the magnitude of the current passing through the active switching device.

38. The energy recovery circuit of claim 29, wherein the active switching device is a transistor and the isolation device is a diode.

* * * * *